(12) United States Patent
Matsubara et al.

(10) Patent No.: US 7,023,638 B2
(45) Date of Patent: Apr. 4, 2006

(54) DATA STORAGE DEVICE, DATA READ CORRECTION MECHANISM, AND DATA READ CONTROL METHOD

(75) Inventors: Nobuya Matsubara, Fujisawa (JP); Fuminori Sai, Yokohama (JP); Kohji Takasaki, Yoohama (JP); Noboru Yoshida, Yamato (JP)

(73) Assignee: Hitachi Global Storage Technologies Netherlands B.V., Amsterdam (NL)

( * ) Notice: Subject to any disclaimer, the term of this patent is extended or adjusted under 35 U.S.C. 154(b) by 0 days.

(21) Appl. No.: 10/676,639

(22) Filed: Sep. 30, 2003

(65) Prior Publication Data
US 2004/0120063 A1    Jun. 24, 2004

(30) Foreign Application Priority Data
Nov. 6, 2002 (JP) .............................. 2002-323126

(51) Int. Cl.
*G11B 5/09* (2006.01)

(52) U.S. Cl. ............................ 360/51; 360/31; 360/42; 360/39; 360/53; 360/25

(58) Field of Classification Search ................ 360/51, 360/42, 20, 39, 48, 60, 53, 69, 77.02, 25, 360/55; 327/156; 331/39–40, 34
See application file for complete search history.

(56) References Cited

U.S. PATENT DOCUMENTS

| | | | | |
|---|---|---|---|---|
| 5,436,770 A | * | 7/1995 | Muto et al. | .................... 360/51 |
| 5,677,802 A | * | 10/1997 | Saiki et al. | .................... 360/51 |
| 6,028,727 A | * | 2/2000 | Vishakhadatta et al. | ...... 360/51 |
| 6,788,484 B1 | * | 9/2004 | Honma | ......................... 360/51 |

FOREIGN PATENT DOCUMENTS

JP        10-027435       *  1/1998

OTHER PUBLICATIONS

"Disk File With Arm Mounted Electronics", Jan. 1980, IBM Technical Disclosure Bulletin, vol. No. 22, Issue No. 8B, pp. 3803-3806.*

Spagna, Fluvio, "Phase Locked Loop Using Delay Compensation Techniques", Jul. 2000, 5th IEEE Symposium on Computers and Communications Proceedings 2000, pp. 417-423.*

Du et al., "A Linearly Constrained Adaptive FIR Filter For Hard Disk Drive Read Channels", Jun. 1997, IEEE International Conference on Communications, vol. No. 3, pp. 1613-1617.*

* cited by examiner

*Primary Examiner*—David Hudspeth
*Assistant Examiner*—Natalia Figueroa
(74) *Attorney, Agent, or Firm*—Townsend and Townsend and Crew LLP

(57) ABSTRACT

A correction mechanism for use in a data storage system that allows data to be read even if the recorded data has been phase shifted.

13 Claims, 5 Drawing Sheets

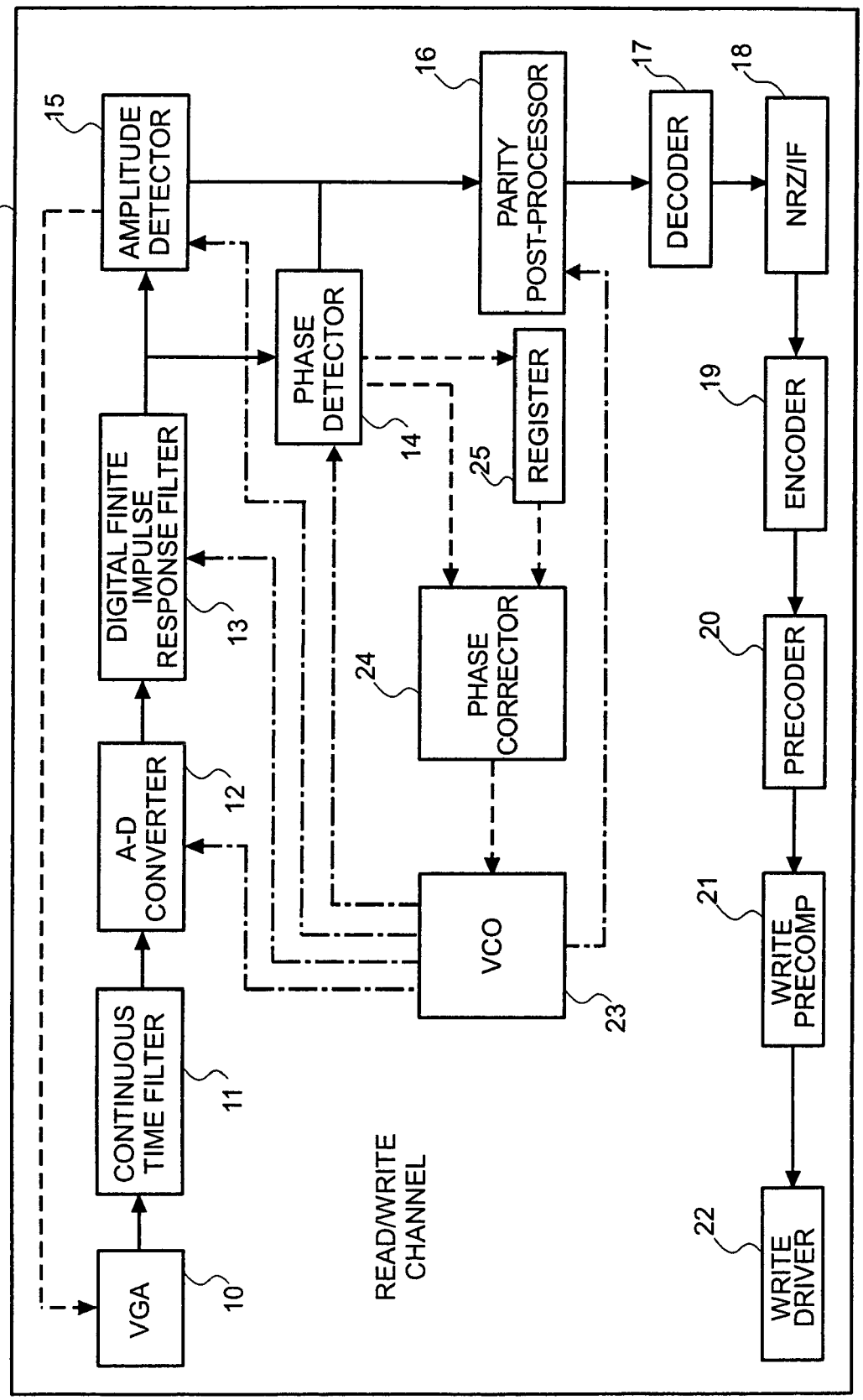

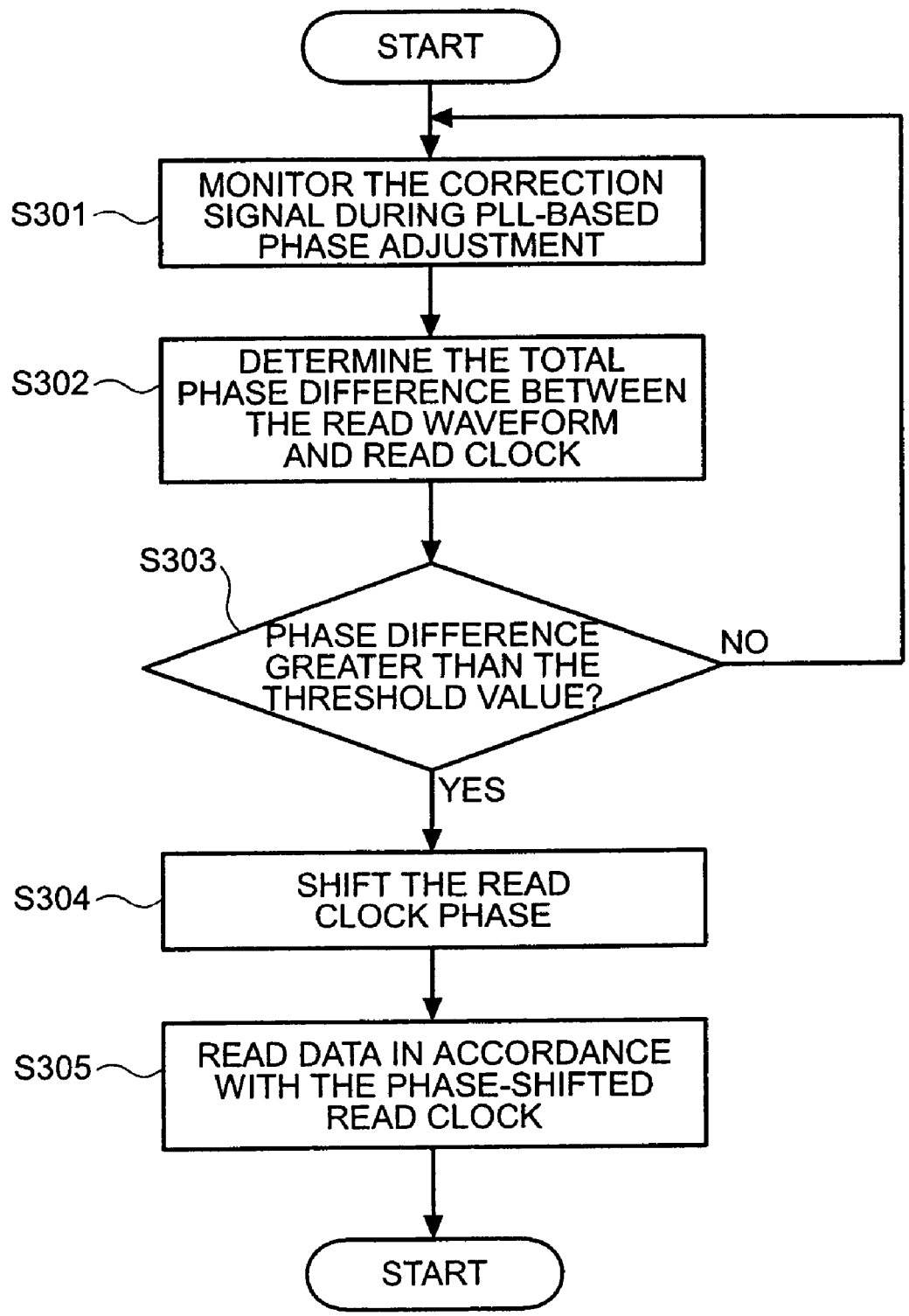

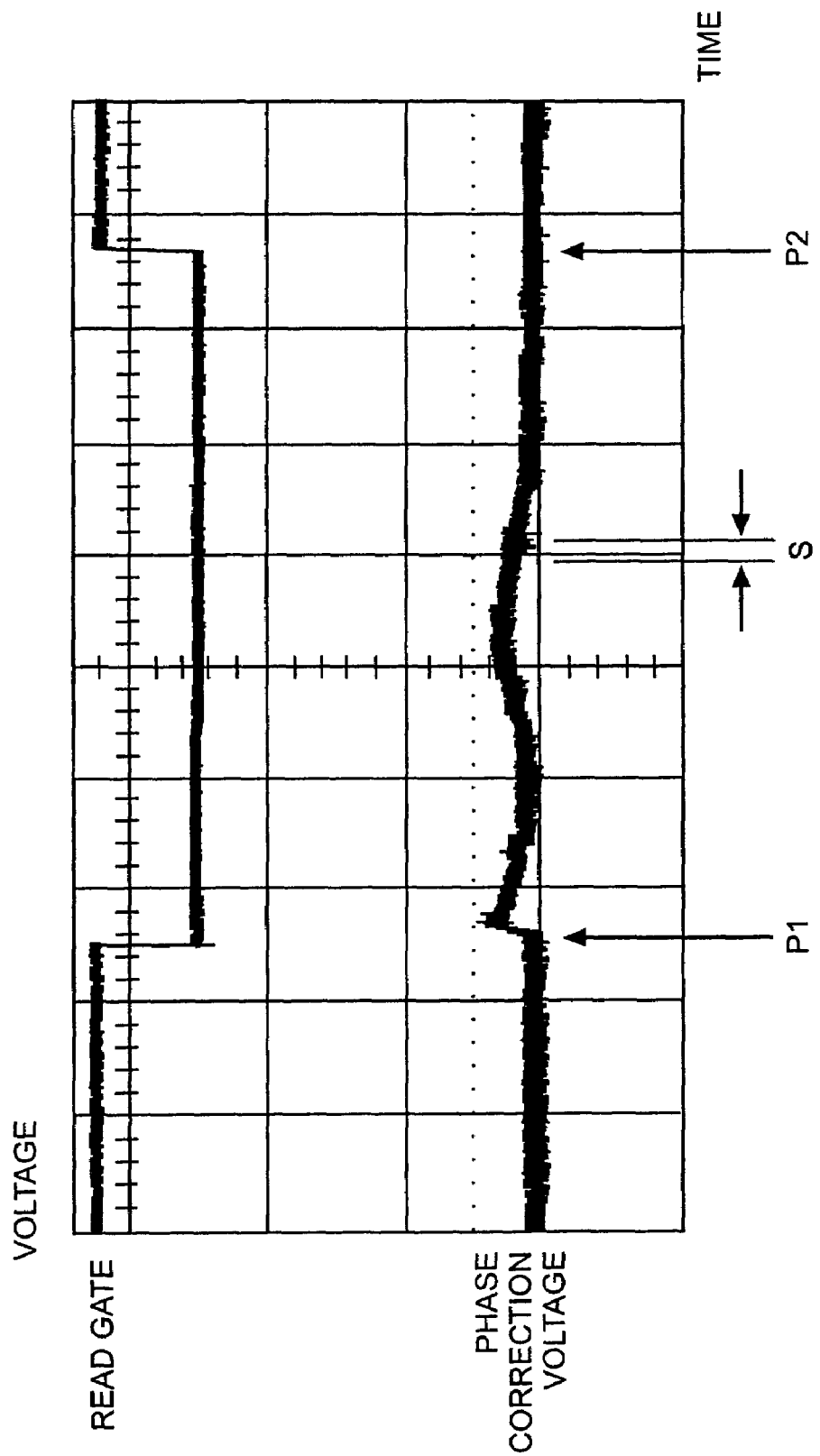

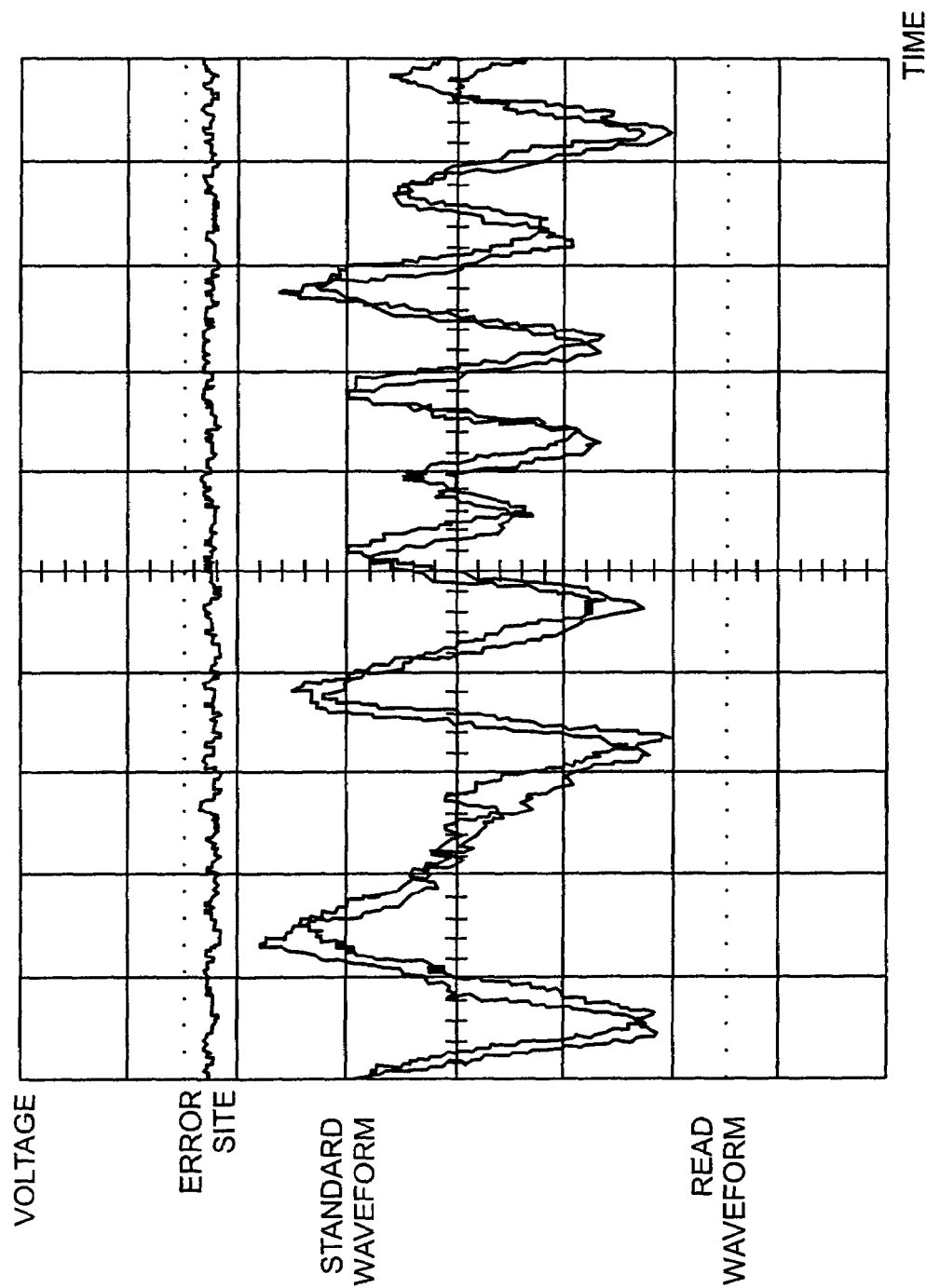

DATA STORAGE DEVICE, DATA READ CORRECTION MECHANISM, AND DATA READ CONTROL METHOD

FIELD OF THE INVENTION

The present invention relates to a data storage device, and more particularly to a correction mechanism for use in reading data written on a magnetic disk or other recording medium.

BACKGROUND OF THE INVENTION

In a magnetic storage device which uses a magnetic disk, magnetic tape, or other medium as a recording medium (hereinafter referred to as a magnetic recording medium), a data write magnetic head magnetizes a magnetizable material coated on a disk or tape so as to record data in the form of a magnetic pattern which varies with the magnetic strength. To perform a data read, a data read magnetic head reads a magnetic pattern remaining in the magnetizable material of the magnetic recording medium as a signal and decodes the read signal. The magnetic storage device reads/writes data while the magnetic heads are in contact with or slightly apart from the magnetic recording medium.

As described above, the magnetic storage device records data in the form of a magnetic pattern, which is obtained by magnetizing the magnetizable material of the magnetic recording medium. To read/write data accurately, it is essential that the distance between the magnetic heads and magnetic recording medium be fixed. However, if dust or dirt enters the space between the magnetic heads and magnetic recording medium, the distance between the magnetic heads and magnetic recording medium becomes variable, thereby adversely affecting the data read/write performance. Typical adverse influences would be amplitude changes and phase changes in a read signal and write signal as discussed by Sarigoz et al., Fatih Sarigoz, Gang Li, B. V. K. Vijaya Kumar, James A. Barin, Jian-Gang Zhu, "Analysis of Dropout Peakshift in Magnetic Tape Recording", IEEE TRANSACTIONS ON MAGNETICS, Vol. 36, No. 5, September 2000

As described above, the read/write performance of the magnetic storage device may deteriorate if the distance between the magnetic heads and magnetic recording medium becomes variable due to dust or dirt existence between them. When a data read operation is adversely affected and rendered unsuccessful, a data read can be performed again. However, if a data write operation is adversely affected, the loss of recorded data readability or other serious problem may arise.

Particularly if the phase of a write signal is significantly shifted due, for instance, to the influence of dust or dirt during data recording onto a magnetic recording medium, data is recorded on the magnetic recording medium with the phase shifted. Consequently, when the data is read, the resulting read signal contains a significant phase shift so that desired data cannot be obtained.

In recent years, the magnetic disk's data recording density has been remarkably increased in order to increase the capacity of a magnetic disk device. Therefore, an increased degree of data read accuracy is called for. As a result, it is now necessary to effectively avert the aforementioned influence of dust/dirt inclusion between the magnetic heads and magnetic recording medium.

SUMMARY OF THE INVENTION

In order to address the concerns discussed above, the present invention provides a correction mechanism that makes it possible to read recorded data depending on the phase changes in a read signal if the data is recorded on a magnetic recording medium with the phase shifted. It is a further advantage of this invention that it provides a magnetic storage device that incorporates the above correction mechanism. It is an advantage of the present invention that it ensures that data can be read in accordance with changes in the phase of a read signal even when the data is recorded on a magnetic recording medium with the phase shifted.

The present invention is to be implemented as a data storage device in order to achieve the above objects. The data storage device of the present invention uses a magnetic disk, magnetic drum, or other magnetic recording medium, and comprises a magnetic head which is capable of reading the magnetic information recorded on the magnetic recording medium to obtain a read signal, a data read means for converting the read signal into desired data in synchronism with a read clock signal, and a read clock control means for controlling the phase of the read clock signal in accordance with the phase of the read signal.

The data read means and read clock control means are provided as the functions of a read/write channel. The data storage device further comprises a storage means for storing the information about the phase of the read signal. If the phase difference between the read signal and read clock signal is greater than predefined, the read clock control means can correct the phase of the read clock signal in accordance with the information about the phase of the read signal stored in the storage means. As the storage means, a register provided for the read/write channel or a memory provided for a hard disk controller may be used.

The present invention for achieving the above objects is also to be implemented as a correction mechanism. The correction mechanism of the present invention corrects the operation in a data read process for reading data written on a recording medium, and comprises a phase detector for detecting the phase of a read signal which is obtained by reading the information recorded on the recording medium, an oscillator for generating a read control signal which converts the read signal into desired data, and a phase corrector for controlling the oscillator in accordance with the phase of the read signal, which is detected by the phase detector, in order to correct the phase of the read control signal generated by the oscillator. More specifically, the phase corrector compares the phases of the read signal and read control signal to recognize a phase difference and then shifts the phase of the read control signal until it coincides with the phase of the read signal.

The present invention is also to be implemented as a data read control method for reading data written on a magnetic disk or other recording medium. The data read control method of the present invention comprises the step of acquiring a read signal of information recorded on the recording medium, the step of converting the read signal into desired data in synchronism with a read clock signal, and the step of making corrections, if data is not successfully read due to a phase difference between the read clock signal and read signal, to adjust the phase of the read clock signal for the phase of the read signal.

Preferably, the data read control method sets a window at a position at which data has not been successfully read, and converts a read signal in the window to data again by using, within the window, a read clock signal whose phase is corrected. Alternatively, in the step of converting the read signal to desired data, the data read control method converts, after the phase of the read clock signal is corrected, the read signal at a read failure position to data by using the read clock signal whose phase is corrected.

BRIEF DESCRIPTION OF THE DRAWINGS

For a fuller understanding of the nature and advantages of the present invention, as well as the preferred mode of use, reference should be made to the following drawings, wherein:

FIG. 2 schematizes the functions of a read/write channel according to one embodiment;

FIG. 3 is a flowchart illustrating the read clock control operation that is performed by a read/write channel according to one embodiment;

FIG. 4 is a diagram illustrating the changes in a PLL-based correction signal; and FIG. 5 presents a view that is magnified in horizontal direction (in the direction of time) to show a read signal within region S of a waveform in FIG. 4.

DETAILED DESCRIPTION OF THE PREFERED EMBODIMENTS

Figure 1:
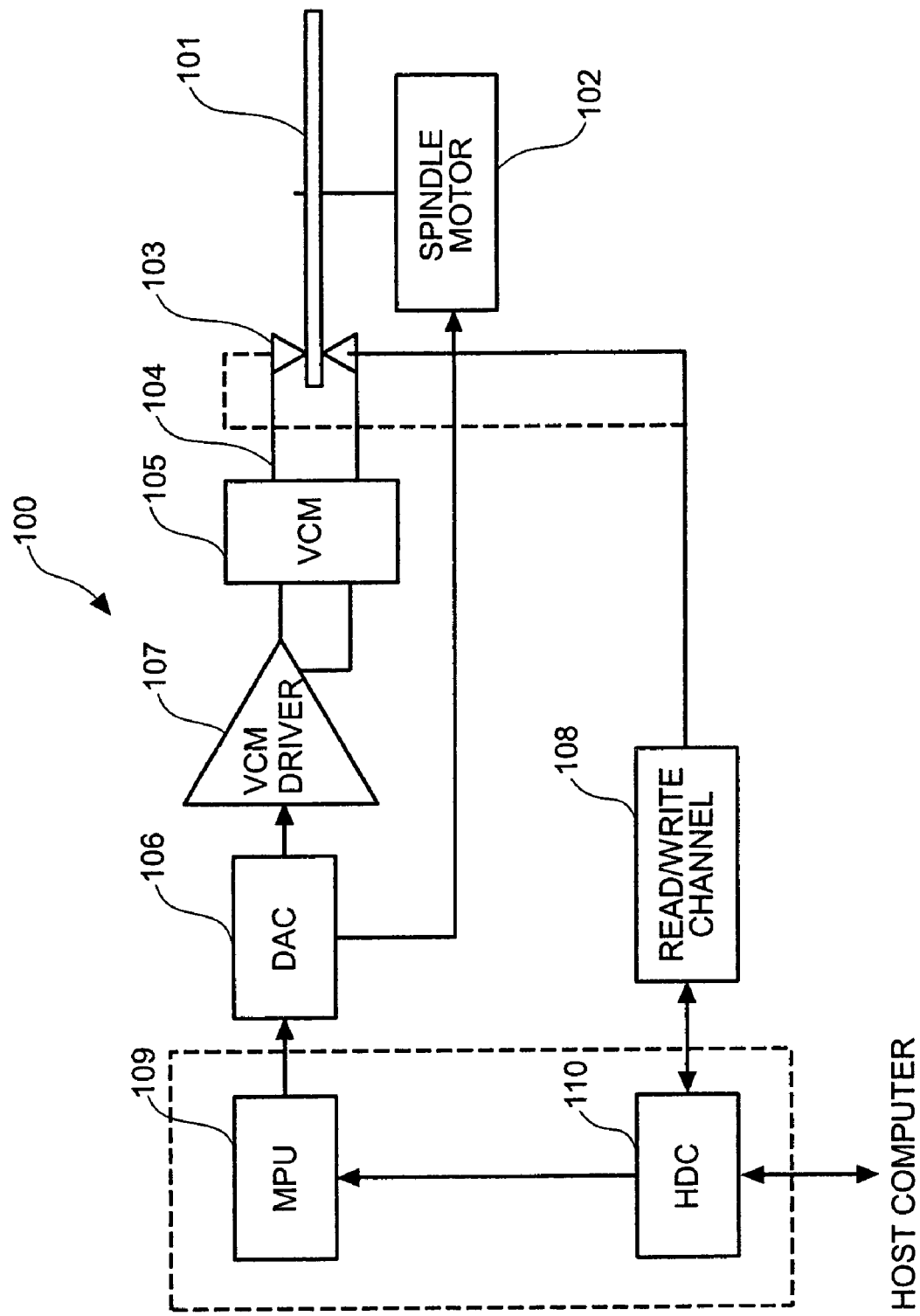
FIG. 1 is a block diagram illustrating the major components of a hard disk drive according to one embodiment.

One embodiment of the present invention will now be described in detail with reference to the accompanying drawings. For the convenience of explanation, a hard disk drive that uses a magnetic disk as a magnetic recording medium will be described.

FIG. 1 is a block diagram illustrating the major components of a hard disk drive 100. The hard disk drive 100 is a data storage/playback device in which a magnetic head 103 performs a seek over a magnetic disk 101, which is driven and rotated by a spindle motor 102, and stays over a specified track (at a specified position) to write data onto the magnetic disk 101 or reads data written on the magnetic disk 101. The magnetic disk 101 is a recording medium for recording data as magnetic information. One or more units of the magnetic disk are installed in the hard disk drive. However, FIG. 1 shows an example in which only one unit of the magnetic disk is used.

While the hard disk drive 100 is operating, the magnetic disk 101 is driven to rotate around the spindle axis of a spindle motor 102. When the hard disk drive 100 stops operating, the magnetic disk 101 stops rotating (comes to a standstill). Two units of the magnetic head 103 are mounted at the end of an actuator 104 in such a manner that they are properly positioned relative to the front and back surfaces of the magnetic disk 101. These units of the magnetic head 103 write data onto or read data from the magnetic disk 101. The actuator 104 is driven by a voice coil motor (VCM) 105, which is controlled by an MPU (microprocessing unit) 109 via a digital-to-analog converter (DAC) 106 and a voice coil motor (VCM) driver 107.

A read/write channel 108 performs a data read/write process. More specifically, a data write is performed by receiving write data, which is transferred from a host computer via an HDC (hard disk controller) 110, converting the write data to a write signal (current), and supplying the write signal to the magnetic head 103. In accordance with the supplied write current, the magnetic head 103 writes data onto the magnetic disk 101. In a data read, on the other hand, a read signal (current) read from the magnetic disk 101 is converted to digital data and then output to the host computer via the HDC 110.

The HDC 110 is capable of interfacing with the hard disk drive 100. The HDC 110 receives write data, which is transferred from the host computer, and transfers it to the read/write channel 108. The HDC 110 also receives read data, which is transferred from the read/write channel 108, and transfers it to the host computer. In addition, the HDC 110 receives directive commands and other instructions from the host computer and transfers them to the MPU 109. The MPU 109 provides control over the hard disk drive 100.

In the read/write channel 108 of the hard disk drive 100 described above, the present embodiment checks at the time of a data read whether the phase of a data read signal recorded on the magnetic disk 101 is shifted. If any phase shift is found, the present embodiment corrects the affected operation properly to ensure that a data read can be performed.

FIG. 2 schematizes the functions of the read/write channel 108 according to the present embodiment. As shown in FIG. 2, the read/write channel 108 according to the present embodiment has a data read means, which exercises various functions for use during a data read. The data read means comprises a VGA (variable gain amplifier) 10, a continuous time filter 11, an A-D converter (analog-to-digital converter) 12, a digital finite impulse response filter 13, a phase detector 14, an amplitude detector 15, a parity post-processor 16, a decoder 17, and an NRZ/IF (non-return to zero/interface) 18. The read/write channel 108 also has a data write means, which exercises various functions for use during a data write. The data write means comprises an NRZ/IF (non-return to zero/interface) 18, an encoder 19, a precoder 20, a write precomp 21, and a write driver 22. Further, the read/write channel 108 has a read control signal (read clock) control means, which comprises a VCO (voltage-controlled oscillator) 23 for forming a control loop for a data read, a phase corrector 24, and a register 25 that is used as needed during processes performed by various functional components mentioned above. In FIG. 2, solid arrows represent the signal flows for the data that is written onto or read from the magnetic disk 101, whereas dashed arrows represent the signal flows for a control loop. The read clock supplied from the VCO 23 is especially represented by dashed-dotted arrows. The write clock, which is supplied from the VCO 23 when the read/write channel 108 performs a data write, is not shown.

In the configuration described above, the VGA 10 inputs a read signal, which is obtained when the magnetic head 103 reads magnetic information recorded on the magnetic disk 101, and normalizes the amplitude of the read/write signal for the level used in an analog circuit within the read/write channel 108. The gain of the VGA 10 is fed back by the amplitude detector 15.

The continuous time filter 11 is an analog filter (low-pass filter), which eliminates band noise. The A-D converter 12 receives a read signal, which is an analog signal read from the magnetic disk 101 by the magnetic head 103, and converts the read analog signal to a digital signal. The digital finite impulse response filter 13 is a digital filter for adjusting the amplitude of the read signal, which is converted to a digital signal, and changes in the amplitude ratio between high and low frequencies (resolution).

The phase detector 14 and amplitude detector 15 are detectors for detecting the most accurate code (which minimizes the error or the deviation from an ideal sample value) when there is a correlation between read signal data (namely when it is probable that the accuracy of data transition is high). The phase detector 14 detects the phase of the read signal, whereas the amplitude detector 15 detects the amplitude of the read signal.

The parity post-processor 16 uses parity data, which is attached to the data, to check for a detection error that might be produced by the phase detector 14 or amplitude detector 15, and corrects the data as needed. The decoder 17 receives a read signal that is encoded and, if necessary, error-corrected, and then converts the read signal to binary data. The data obtained in this manner is handled as the read data that is read from the magnetic disk 101.

The NRZ/IF 18 is a data bus interface for connecting the read/write channel 108 to the HDC 110. The read data decoded by the decoder 17 is sent to the HDC 110 via the NRZ/IF 18. The write data to be written onto the magnetic disk 101 is sent to the encoder 19 via the NRZ/IF 18.

The encoder 19 receives binary data, which is the write data to be written onto the magnetic disk 101, from the NRZ/IF 18, and converts it to a write signal. The precoder 20 performs a signal process for excluding the influence of noise, which is based on the PRML (partial response maximum likelihood) method. In this process, the precoder 20 processes (precodes) the write data to make corrections in accordance with the predicted read data characteristics.

The write precomp 21 shifts the write signal's phase (translation) in consideration of the magnetic recording characteristics when a data write is performed. The write driver 22 interfaces with a preamplifier circuit that controls a data write by the magnetic head 103. The signal output from the write driver 22 controls the magnetic field generated by the magnetic head 103 via the preamplifier circuit so that a data write is performed by magnetizing the magnetizable material of the magnetic disk 101.

The VCO 23 generates the read clock for a data read and the write clock for a data write. Further, the VCO 23 coordinates with the phase detector 14 to form a PLL (phase-locked loop). The read clock for a data read is supplied to the A-D converter 12, digital finite impulse response filter 13, phase detector 14, and amplitude detector 15 and used to acquire the frequency and phase of the read signal. The write clock for a data write is supplied as a stabilized reference clock while a write operation is performed.

The phase corrector 24 inputs the output of the phase detector 14 and determines the read signal's phase shift from the read clock. If the determined phase shift is greater than predefined, the phase corrector 24 corrects the phase of the detection signal of the phase detector 14 by the amount of the determined phase shift and then returns the phase-corrected signal to the VCO 23. As a result, the read clock output from the VCO 23 is shifted by the amount of the determined phase shift.

In other words, the phase difference between the read clock output from the VCO 23 and the read signal is determined from the output of the phase detector 14, and feedback control is exercised so that the VCO 23 is controlled to let the phase corrector 24 adjust the phase of the read clock for the phase of the read signal.

The register 25 reads/writes parameters or other information about the read/write channel 108. This register also stores a threshold value for determining whether the phase corrector 24 should make phase corrections.

The correction process that the read/write channel 108 performs during a data read will now be described. In the present embodiment, the phase detector 14 and VCO 23 are initially used to make common PLL-based phase adjustments until the phase of the read clock coincides with the phase of the read signal. If the phase difference between the read clock and read signal is greater than predefined (greater than a predefined threshold value), the phase corrector 24 corrects the phase of the read clock.

FIG. 3 is a flowchart illustrating the read clock control operation that is performed by the read/write channel 108 of the present embodiment. As described above, common PLL-based phase adjustments are initially made for the read clock and read signal. However, the phase corrector 24 monitors the correction signal during such a phase adjustment process (step 301). The correction information obtained in this step is stored, for instance, in the register 25 as phase detection error information. The error information contains the target phase position (specified by time) and the phase difference at the target phase position between the read clock and read signal.

FIG. 4 is a diagram illustrating the changes in the voltage (VCO cap.) that is applied as a PLL-based correction signal for controlling the VCO 23. FIG. 5 presents a view that is magnified in horizontal direction (in the direction of time) to show the read signal within region S of a waveform in FIG. 4. In FIG. 5, a black line is used to depict the associated waveform shown in FIG. 4, whereas a gray line is used to depict the waveform of a read signal that prevails when the associated data is normally recorded on the magnetic disk 101 (hereinafter referred to as the standard waveform). The standard waveform is in phase with the read clock.

FIG. 4 indicates that the operation of the VCO 23 becomes unstable at time P1, making it impossible to make PLL-based phase adjustments. Meanwhile, FIG. 5 indicates that the actual read signal waveform drawn by a black line (hereinafter referred to as the read waveform) is delayed in phase with respect to the standard waveform drawn by a gray line. The phase difference between the read waveform and read clock is adjusted at time P2 in FIG. 4 so that PLL-based control can be exercised subsequently.

The phase corrector 24 of the read/write channel 108 acquires error information stored in the register 25, and determines the total phase difference between the read waveform and read clock (step 302). The phase corrector 24 then compares the determined total phase difference against the threshold value stored in the register 25. The threshold value represents the phase difference between the read waveform and read clock (approximately several tenths of a nanosecond) at which a data read cannot be achieved. It is to be set as appropriate in accordance with the PLL-based phase adjustment performance and the types of the magnetic disk 101 and magnetic head 103.

If the phase difference between the read waveform and read clock increases so that the total phase difference exceeds the threshold value stored in the register 25 as at time P1 in FIG. 4, the phase corrector 24 delays the read clock by the amount of the resultant phase difference (namely by shifting the phase) and then supplies the read clock to the VCO 23 (steps 303 and 304).

The VCO 23 inputs the read signal whose phase was shifted in step 304, and outputs a read clock whose phase is adjusted for the phase of the read signal. The read/write channel 108 performs a data read in accordance with the phase-shifted read clock (step 305). In this instance, the read/write channel 108 rereads the data, which is in read error due to the phase difference between the read waveform and read clock, in synchronism with the phase-shifted read clock. For this data read operation (to be performed using the phase-shifted read clock), two methods can be used.

The first method is to set a window (specific period) at a location of a read error occurrence so as to use, within the window, a read clock whose phase is shifted in step 304, and use a normal, PLL-controlled read clock elsewhere. In the waveform diagram shown in FIG. 4, a data read error occurred during a period between time P1 and time P2 due to the phase difference between the read waveform and read clock. Therefore, when a reread operation is performed with a window set for such a time period, the associated data can be read.

The second method is to use a read clock whose phase is shifted in step 304 for the purpose of achieving synchronism in the subsequent operation of the read/write channel 108 and exercise PLL-based control within the read/write channel 108. This method rereads the data with the read clock shifted by the amount of the phase difference each time the phase difference between the read waveform and read clock becomes greater than a predefined difference.

In the embodiment described above, the register 25 stores the error information obtained from the phase detector 14. However, such error information can alternatively be stored in the HDC 110. In such an alternative embodiment, the obtained error information is converted into an NRZ signal, sent to the HDC 110 via the NRZ/IF 18, and retained in a storage means (e.g., SDRAM) provided for the HDC 110. The phase corrector 24 acquires the error information from the HDC 110 via the NRZ/IF 18 and then performs the aforementioned correction operation.

For the convenience of explanation, the use of a hard disk drive is assumed for the present embodiment. However, it is obvious that the phase correction mechanism of the present invention is also applicable to various other magnetic storage devices, which use a magnetic tape or magnetic drum as a recording medium. Further, the present invention can also be applied to a correction mechanism for use in various storage devices other than a magnetic storage device when a data read is unachievable due to a read signal phase shift.

As described above, the present invention makes it possible to read data in accordance with changes in the phase of a read signal even when the data is recorded on a magnetic recording medium with the phase shifted.

A correction mechanism is incorporated in a magnetic disk device or other data storage device. A phase detector 14 is used to detect the phase of a read signal that is obtained by reading the information recorded on a recording medium. A VCO 23 is used to generate a read clock for converting the read signal into desired data. Further, a phase corrector 24 is provided to control the VCO 23 in accordance with the phase of the read signal detected by the phase detector 14 for the purpose of adjusting the phase of the read clock for the phase of the read signal.

What is claimed is:

1. A data storage device based on a magnetic recording medium, comprising:
   a magnetic head for reading magnetic information recorded on said magnetic recording medium and acquiring a read signal;
   a data read means for converting said read signal read by said magnetic head into desired data in synchronism with a read clock signal; and
   a read clock control means for controlling the phase of said read clock signal in accordance with the phase of said read signal read by said magnetic head to correct the phase of said read clock signal if a phase shift between said read clock signal and said read signal exceeds a predefined value;
   wherein data is not successfully read by the data read means with the phase shift exceeding the predefined value.

2. The data storage device according to claim 1, wherein said read clock control means comprises an oscillation means for generating said read clock signal and a correction means for controlling said oscillation means in such a manner as to recognize the phase difference between the read clock signal generated by said oscillation means and said read signal and adjust the phase of the read clock signal for the phase of the read signal.

3. The data storage device according to claim 1, wherein said data read means and said read clock control means are furnished as the functions of a read/write channel.

4. The data storage device according to claim 1, further comprising:
   a storage means for storing the information about the phase of said read signal;
   wherein said read clock control means corrects the phase of said read clock signal in accordance with the information about the phase of said read signal, which is stored in said storage means, if the phase difference between said read signal and said read clock signal is greater than the predefined value.

5. The data storage device according to claim 4, wherein said storage means is a register provided for the read/write channel.

6. The data storage device according to claim 4, wherein said storage means is a memory provided for a hard disk controller.

7. The data storage device according to claim 1, wherein, if data is not successfully read due to a phase difference between said read clock signal and said read signal, said data read means sets a window at a position at which the data has not been successfully read, and wherein the read clock signal whose phase is controlled by said read clock control means is used within the window to read the data again.

8. The data storage device according to claim 1, wherein, if data is not successfully read due to a phase difference between said read clock signal and said read signal, said data read means uses the read clock signal whose phase is controlled by said read clock control means to perform a data read again at a position at which the data has not been successfully read.

9. The data storage device according to claim 1, wherein the read clock control means is stable when the phase shift between the read clock signal and the read signal is not greater than the predefined value, making PLL (phase-locked loop) based phase adjustments possible.

10. A data read control method for reading data written on a predefined recording medium, comprising:
    acquiring a read signal of information recorded on said recording medium;
    converting said read signal into desired data in synchronism with a read clock signal, wherein data is not successfully read with a phase shift between said read clock signal and said read signal exceeding a predefined value; and
    making corrections, if data is not successfully read due to said phase difference between said read clock signal and said read signal with said phase difference exceeding said predefined value, to adjust the phase of the read clock signal for the phase of the read signal.

11. The data read control method according to claim 10, further comprising setting a window at a position at which said data has not been successfully read, and converting said read signal in the window to data again by using, within the window, said read clock signal whose phase is corrected.

12. The data read control method according to claim 10, wherein converting said read signal to desired data converts, after the phase of said read clock signal is corrected, the read signal at a read failure position to data by using the read clock signal whose phase is corrected.

13. The data read control method according to claim 10, further comprising, if the phase difference is not greater than the predefined value, performing PLL (phase-locked loop) based phase adjustments to the phase of the read clock signal to match the phase of the read signal.

* * * * *